United States Patent
Liu

(10) Patent No.: US 9,774,336 B2
(45) Date of Patent: Sep. 26, 2017

(54) ALL-DIGITAL-PHASE-LOCKED-LOOP HAVING A TIME-TO-DIGITAL CONVERTER CIRCUIT WITH A DYNAMICALLY ADJUSTABLE OFFSET DELAY

(71) Applicant: Stichting IMEC Nederland, Eindhoven (NL)

(72) Inventor: Yao-Hong Liu, Eindhoven (NL)

(73) Assignee: Stichting IMEC Nederland, Eindhoven (NL)

(*) Notice: Subject to any disclaimer, the term of this patent is extended or adjusted under 35 U.S.C. 154(b) by 0 days.

(21) Appl. No.: 14/975,834

(22) Filed: Dec. 20, 2015

(65) Prior Publication Data
US 2016/0182067 A1 Jun. 23, 2016

(30) Foreign Application Priority Data
Dec. 19, 2014 (EP) .................................. 14199426

(51) Int. Cl.
*H03L 7/06* (2006.01)
*H03L 7/099* (2006.01)
*H03L 7/091* (2006.01)
*G04F 10/00* (2006.01)
*H03L 7/081* (2006.01)

(52) U.S. Cl.
CPC .......... *H03L 7/0991* (2013.01); *G04F 10/005* (2013.01); *H03L 7/0814* (2013.01); *H03L 7/091* (2013.01); *H03L 2207/50* (2013.01)

(58) Field of Classification Search
CPC ............................ H03L 7/0991; H03L 7/0814
USPC .......... 327/147–163; 375/373–376; 331/1 R, 331/1 A, 18, 34, 44, 65, 66, 175, 176
See application file for complete search history.

(56) References Cited

U.S. PATENT DOCUMENTS

| 8,570,082 B1* | 10/2013 | Kuo .......................... H03L 1/00 327/158 |
| 2009/0096535 A1 | 4/2009 | Chang | |

OTHER PUBLICATIONS

European Search Report, European Patent Application No. 14199426.9, dated Apr. 7, 2015, 7 pages.
Zhuang, Jingcheng et al., "A Low-Power All-Digital PLL Architecture Based on Phase Prediction," 19th IEEE—International Conference on Electronics, Circuits and Systems (ICECS), Dec. 9-12, 2012, pp. 797-800.

* cited by examiner

*Primary Examiner* — Thomas Skibinski
(74) *Attorney, Agent, or Firm* — McDonnell Boehnen Hulbert & Berghoff LLP

(57) ABSTRACT

An all-digital-phase-locked-loop (ADPLL) includes a digitally controlled oscillator (DCO) arranged to generate a DCO output signal, and a feedback loop comprising a set of components for controlling the DCO. The set of components comprise: a time-to-digital converter (TDC) arranged to generate a TDC output code indicative of the phase difference between the reference signal and the enable signal measured within the predetermined observation window; a subset of components arranged to generate the enable signal from the DCO output signal; and an offset calibration system connected to the TDC output, which when activated is arranged to evaluate the difference between the first and second offset delay values by monitoring the TDC output code generated over a predetermined period of time, and to adjust the difference to position the predetermined observation window with respect to the reference signal.

17 Claims, 7 Drawing Sheets

US 9,774,336 B2

ALL-DIGITAL-PHASE-LOCKED-LOOP HAVING A TIME-TO-DIGITAL CONVERTER CIRCUIT WITH A DYNAMICALLY ADJUSTABLE OFFSET DELAY

CROSS-REFERENCE TO RELATED APPLICATION

The present application is a non-provisional patent application claiming priority to European Patent Application No. 14199426.9 filed on Dec. 19, 2014, the contents of which are hereby incorporated by reference.

TECHNICAL FIELD

The present disclosure relates to an all-digital-phase-locked-loop (ADPLL) and more specifically to an ADPLL having a TDC with a dynamically adjustable offset delay.

BACKGROUND

Ultra-low-power (ULP) transceivers enable short-range networks of autonomous sensor nodes for wireless personal area network (WPAN) applications, such as Bluetooth® Smart and Zigbee®. RF phase-locked-loops (PLLs) for frequency synthesis and modulation consume a significant share of the total transceiver power, making sub-mW PLLs key to realize ULP WPAN radios. Compared to analog PLLs, all-digital PLLs (ADPLLs) are preferred in nanoscale CMOS as they offer benefit from smaller area overhead, programmability, capability of extensive self-calibrations, and easy portability. However, analog PLLs currently still dominate the field of ULP WPAN radios, since the time-to-digital converter (TDC) of an ADPLL has traditionally been power hungry.

An example approach for minimizing the power consumption of a TDC circuit in the ADPLL is to reduce the activity of the TDC so that it operates only within a predetermined observation window. Such a TDC is known from J. Zhuang, et al., "A Low-Power All-Digital PLL Architecture Based on Phase Prediction," ICECS, 2012, where a 2.1-2.7 GHz fractional-N ADPLL for WPAN applications digital-to-time converter (DTC)-assisted snapshot TDC is presented. In this implementation TDC snapshotting is implemented to reduce the sampling rate of the TDC from FCKVD2 (output variable clock (CKV)) to FREF (frequency reference (FREF) clock). A DTC is provided for reducing the detection range of the TDC detection range to less than 1/10 of the digitally-controlled oscillator (DCO) output signal period, leading to a significant power reduction. The accumulated fractional part of the frequency command word, $FCw_{frac}$, controls the DTC to delay the reference signal FREF such that the delayed reference clock $FREF_{dly}$ is almost aligned with CKVD2 (CKV clock divided by 2), once the loop is locked. $FREF_{dly}$ also triggers the snapshot to catch the first CKVD2 edge so that only one CKVD2 edge, CKVD2S, per reference period is fed to the TDC. By capturing only one edge, the snapshot technique guarantees that the TDC has the minimum activity and consume minimum power. Moreover, the snapshotting also minimize the supply switch noise during TDC operation.

A reduced-range TDC operating at the reference frequency (32 MHz) then compares the edge of CKVD2S with $FREF_{dly}$ to provide the fractional phase error, $PHE_F$. This approach reduces both sampling speed and detection range of TDC, leading to around 200× power reduction. In the snapshot TDC, the narrow observation window is opened by the CKVD2s, which acts as a TDC enable signal, after the rising edge of $FREF_{dly}$. Since the TDC captures only the first rising edge of the variable clock, CDVD2, after the rising edge of $FREF_{dly}$, the timing of opening TDC observation window is critical. In order to compensate for the delay added by the snapshot circuit, a TDC "offset delay" (T1) is added between the rising edge of $FREF_{dly}$ and the TDC observation window. However, the TDC and snapshot circuit offset delays cannot be easily estimated due to parasitic or slow logic transitions introduced in the layout during the design phase or during operation. As a result, due to the mismatch between the TDC and snapshot offset delays the TDC may be activated outside of the predetermined observation window, thereby causing the TDC to generate an erroneous output code, resulting in the degradation of the overall PLL performance, e.g. by introducing unwanted phase noise, and sometimes may even lead to an unstable PLL locking.

SUMMARY

The present disclosure provides an ADPLL system which helps to overcome the drawbacks of the generally known approach discussed above.

According to example embodiments of the present disclosure, an all-digital-phase-locked-loop (ADPLL) comprising a digitally controlled oscillator (DCO) arranged for generating a DCO output signal, and a feedback loop comprising a set of components for controlling the DCO. The components provided in the feedback loop comprise a time-to-digital converter (TDC) configured to perform phase detection within a predetermined observation window. The TDC is further configured to receive at least a reference signal having a first offset delay and an enable signal having a second offset delay, and to define the predetermined observation window. The TDC is configured to generate a TDC output code indicative of the phase difference between the reference signal and the enable signal measured within the predetermined observation window. A subset of the components in the feedback loop are configured to generate the enable signal from the DCO output signal, such that the enable signal contains a transition edge derived from the DCO output signal and is arranged for activating the TDC so as to measure the phase difference between the reference signal and the enable signal within the predetermined observation window. In this example, the set of components of the feedback loop also comprises an offset calibration system, connected to the TDC output, which when activated is configured to evaluate the difference between the first and second offset delay values by monitoring the TDC output code generated over a predetermined period of time, and to adjust the difference to position the predetermined observation window with respect to the reference signal.

By providing a calibration system, which when activated is configured to evaluate the difference between the first and second offset delay values, the difference between the first and second offset delay values may be dynamically adjusted so that the TDC is activated within the predetermined observation window. By processing the TDC output code, which is indicative of the phase difference between the reference and the enable signal, it is possible to determine whether the reference signal arrived within the predetermined time difference from the enable signal. As a result based on the TDC output code generated over a predetermined period of time the delay difference between the first and second offset delay values may be adjusted to position the TDC observation window with respect to the reference signal, thereby ensuring that the TDC is operated within the predetermined observation window leading to a higher performing ADPLL.

According to example embodiments of the present disclosure, the calibration system is provided with an offset calibration unit, which is connected to the TDC output. The calibration unit is configured to perform the evaluation of the difference between the first and second offset delay values and accordingly generate a delay adjustment control signal. The calibration system may further be provided with a variable delay unit, which is connected to the offset calibration unit and configured to adjust the first offset delay on the basis of the delay adjustment control signal.

By providing a calibration unit configured to generate, based on the TDC output code, a delay adjustment control signal, which is used to control a variable delay unit, the first offset delay may be dynamically adjusted so that the reference signal arrives within the TDC observation window. In this way, offset delay adjustments may be effected without any external intervention purely based on the TDC output code. The delay adjustment control signal may be indicative of an offset delay adjustment value to be effected by the variable delay unit. The variable delay unit may be a digitally-controlled programmable variable delay configured to adjust the delay of the reference signal based on the delay adjustment control signal generated by the calibration unit, which may be indicative of the value by which the first offset delay needs to be adjusted so that the reference signal arrives within the predetermined observation window. In this way, any variations introduced in the first and second offset delay values may be compensated, thereby ensuring that the TDC operates in the predetermined observation window. As a result, with the system of the present disclosure any variations in the first and second offset delays may be dynamically compensated, thereby ensuring the correct functionality of the TDC, leading to a higher performing ADPLL.

According to example embodiments of the present disclosure, the difference between the first and second offset delay values is adjusted in such a way that a transition edge of the reference signal is positioned substantially in the middle of the predetermined observation window. Positioning the reference signal in the middle of the predetermined observation window helps to ensure that the TDC is provided with sufficient margin to both previous and the proceeding DCO output signal cycles.

According to example embodiments of the present disclosure, the calibration unit is configured to evaluate the difference between the first and second offset delay values by accumulating the number of ones and zeros generated by the TDC output code over the predetermined period of time. For example, the calibration unit may be provided with at least one counter to count the number of ones and zeros generated by the TDC output code over the predetermined period of time. For example, the counter may be configured to count the number of ones and zeros generated by the Most Significant Bit (MSB) of the TDC output code. Accumulating the number of ones and zeros in the TDC output code generated over a predetermined period of time provides a simple and effective way of determining whether the TDC is operated within the predetermined observation window. This is because the number of ones and zeros in the TDC output code generated over a predetermined period of time is directly related to the phase difference between the reference signal and the enable signal and vice versa. As a result, by observing the distribution of the ones and zeros in the TDC output code over the predetermined period of time the phase difference between the reference and enable signal may be easily evaluated.

According to example embodiments of the present disclosure, the ADPLL may comprise a TDC offset control unit configured to generate the delay adjustment control signal based on the accumulated number of ones and zeros in the TDC output code. In this way, the first offset delay of the reference signal may be dynamically adjusted without any external intervention. For example, the TDC offset control unit may be configured to increase the offset delay of the reference signal when the number of zeros is greater than the number of ones in the TDC output code. The TDC offset control unit may also be configured to decrease the offset delay of the reference signal when the number of ones is greater than the number of zeros.

BRIEF DESCRIPTION OF THE DRAWINGS

The disclosure will be further elucidated by means of the following description and the appended Figures.

DETAILED DESCRIPTION

Figure 1:
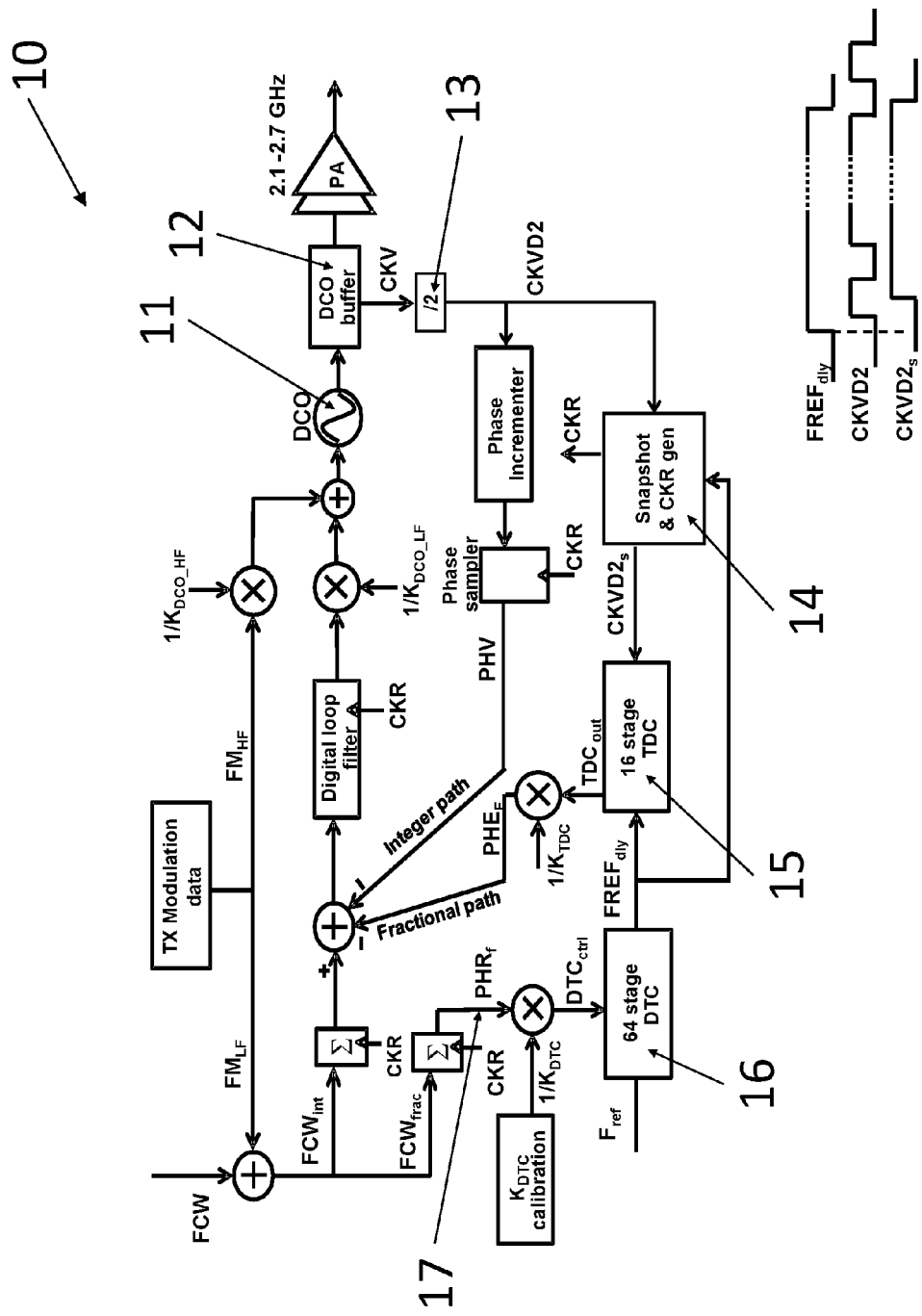
FIG. 1 shows a prior art ADPLL circuit.

The present disclosure will be described with respect to particular embodiments and with reference to certain drawings but the disclosure is not limited thereto but only by the claims. The drawings described are only schematic examples and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

Embodiments of the present disclosure will be explained with reference to the examples shown in FIGS. 1 to 7.

FIG. 1 shows an example of an ADPLL circuit 10, which is arranged for generating, using a digital control oscillator (DCO) 11, a DCO output signal (e.g. an output variable clock (CKV), having a predetermined frequency). The ADPLL is arranged for receiving a reference frequency signal, e.g. FREF, and generate based on a frequency code word (FCW), which may be multiple of the reference signal, the desired DCO output signal, e.g. CKV. In order to ensure that the DCO is maintained stable within the desired frequency range, the ADPLL may be provided with a feedback loop comprising a set of components for controlling the DCO. The components in the feedback loop comprise components for phase detection, which may be done in stages by means of, for example, a subset for detecting a coarse part of the phase (e.g., using a phase incrementor for detecting the integer part of the phase), and a subset for detecting a fine part of the phase (e.g., a subset for detecting the fractional part of the phase).

One such component for detecting a fine part or a fractional part of the phase may be a time-to-digital converter (TDC) 15 arranged for performing phase detection within a predetermined observation window. The TDC 15 may be arranged for receiving at least a reference signal having a first offset delay and an enable signal having a second offset delay and defining the predetermined observation window. The TDC 15 may be arranged for generating a TDC output code indicative of the phase difference between the reference signal and the enable signal measured within the predetermined observation window. For example, the TDC 15 may be arranged for measuring the fractional phase differences between the significant edge of the enable signal and the reference signal, and accordingly generate a TDC output indicative of the fractional phase error (PHE$_f$). The TDC 15 may be arranged for performing phase detection between a reference signal and an enable signal derived from the DCO output signal, e.g. CKV, within a predetermined observation window. To generate the enable signal, the feedback loop may be provided with a first subset of components arranged for generating the enable signal based on a reduced rate DCO output signal, e.g. CKVD2 (CKV clock divided by 2), generated from a multiphase divider 13 such that the enable signal contains a transition edge derived from the DCO output signal. The enable signal generated may be arranged for activating the TDC 15 so as to measure the phase difference between the reference signal and the enable signal within the predetermined observation window.

For example, the first subset of components may comprise a snapshotting circuit 14, which may be triggered by the reference signal for generating an enable signal representing at least one edge of the reduced rate DCO signal, e.g. CKVD2. In this way, only one edge of the reduced rate DCO signal, e.g. may be fed to the TDC per reference period, thereby reducing the activity of the TDC 15 leading to reduced power consumption. By using the reference signal, e.g. FREF, for generating the enable signal which in turns activates the TDC 15, the sampling rate of the TDC 15 may be reduced to the frequency rate of the reference signal. In order to reduce the dynamic range of the TDC 15, a second subset of components may be provided, which may be arranged for positioning the reference signal within the predetermined observation window of the TDC. For example, this may be achieved by providing a digital-to-time converter (DTC) 16, which may be arranged for delaying the reference signal, e.g., FREF$_{dly}$, based on a phase setting control signal generated on the basis of FCW. In this way, a reduced range TDC 15 may be provided for performing the fractional phase detection, thereby reducing the area overhead of the ADPLL 10.

Figure 2:
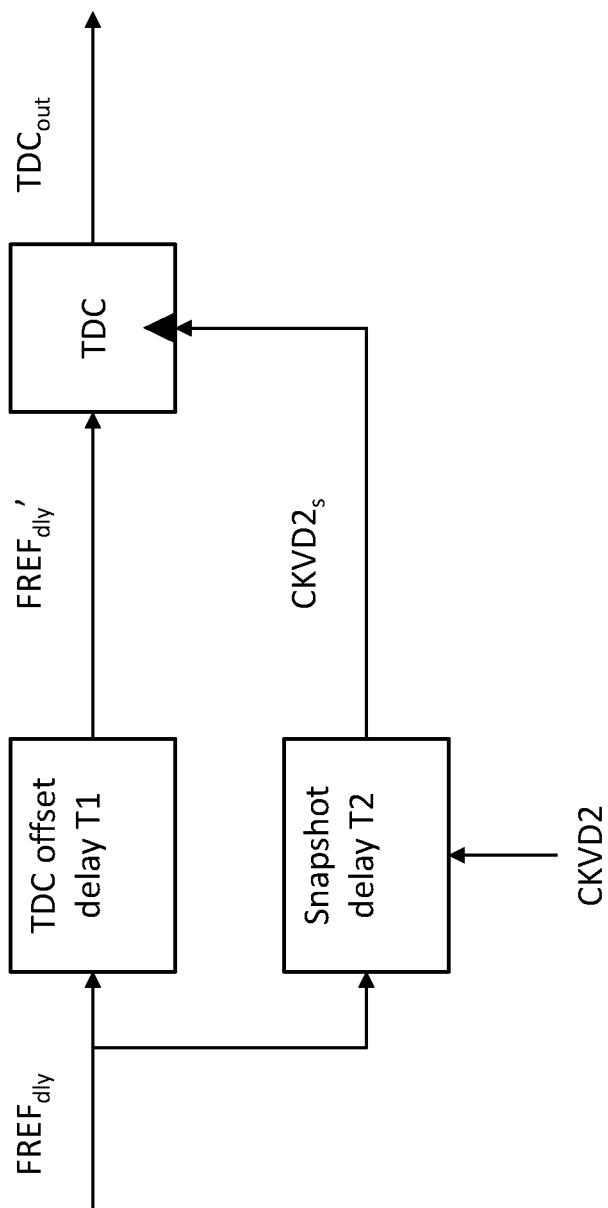
FIG. 2 shows a representation of the offset delays in an ADPLL TDC circuit.
Figures 3A, 3B:
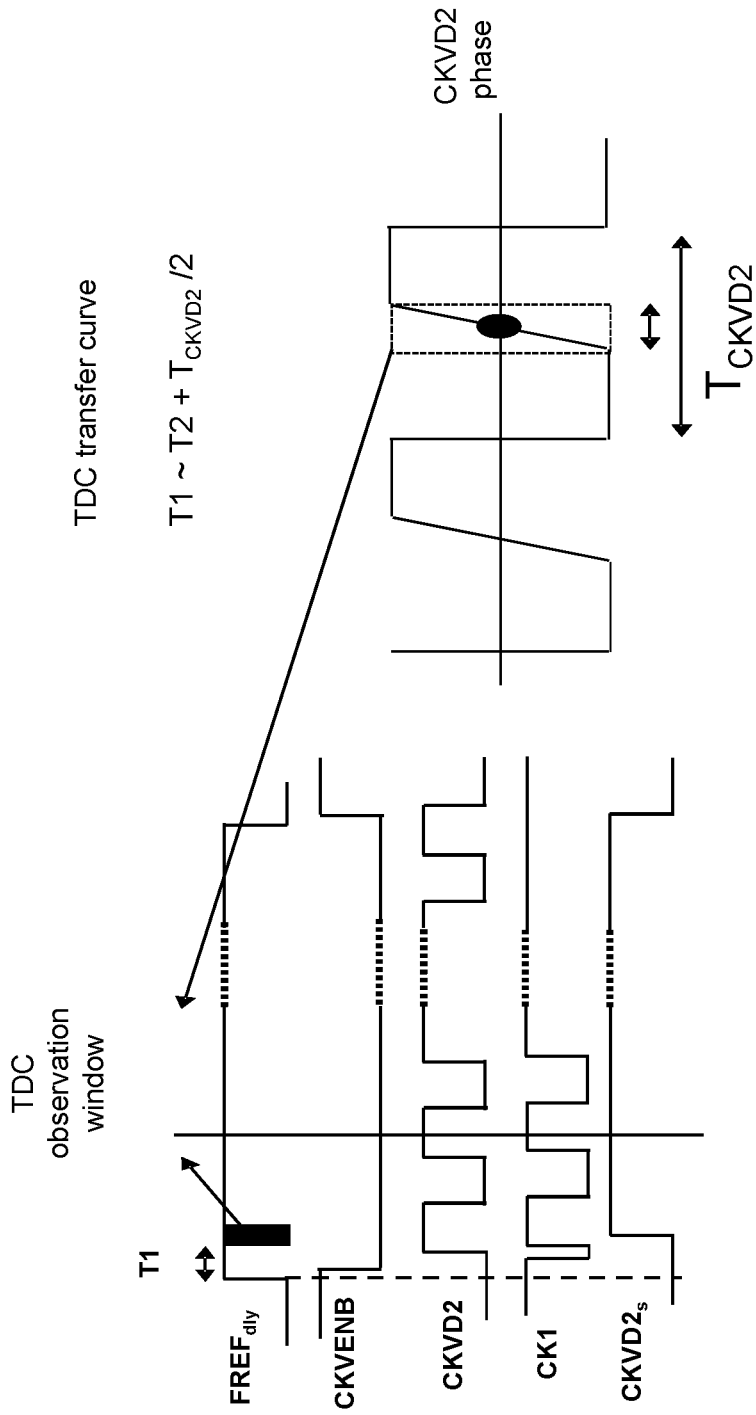
FIGS. 3(a) and 3(b) shows a representation of a TDC transfer curve when the TDC operates within the predetermined observation window.

In order to help ensure that the reference signal, e.g., FREF$_{dly}$, arrives within the predetermined observation window, an offset delay (T1) may be provided in the TDC 15 to compensate for the offset delay (T2) introduced by the first subset of components in the feedback loop arranged for generating the enable signal, e.g. the snapshot circuit, as shown in FIG. 2. Therefore, the reference and enable signal are provided with a first (T1), and second (T2) offset delay. In this way, the reference and enable signal are sampled by the TDC 15 within the TDC observation window as shown in FIG. 3($a$). The first offset delay, e.g. TDC offset delay (T1) may be chosen to be around half the DCO output signal period, e.g. half the CLVD2 period, more than the second offset delay, e.g. snapshot delay T2, such that the TDC observation window is placed at the centre of the TDC transfer curve so as to be provided with sufficient margin to both the previous and the proceeding DCO output signal cycles, as show in FIG. 3($b$).

Figure 4B:
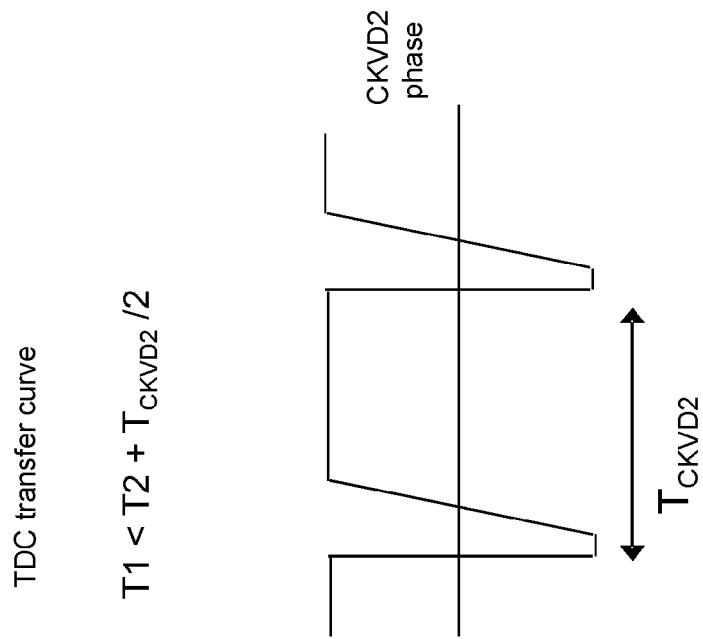
FIGS. 4(a), 4(b), 5(a), and 5(b) show representations of the TDC transfer curve when it operates outside of the predetermined observation window.
Figure 4A:
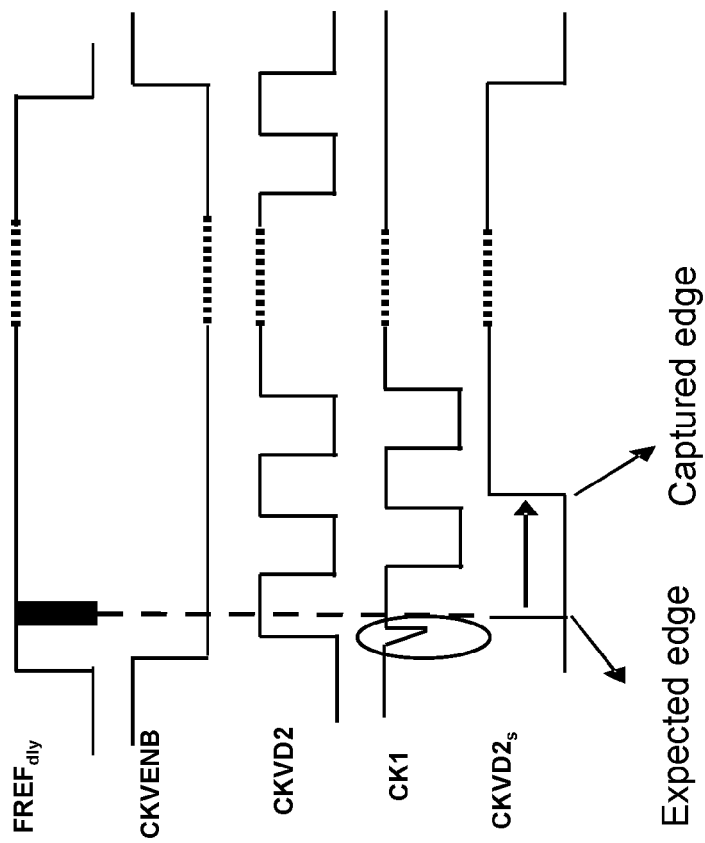
Figure 5B:
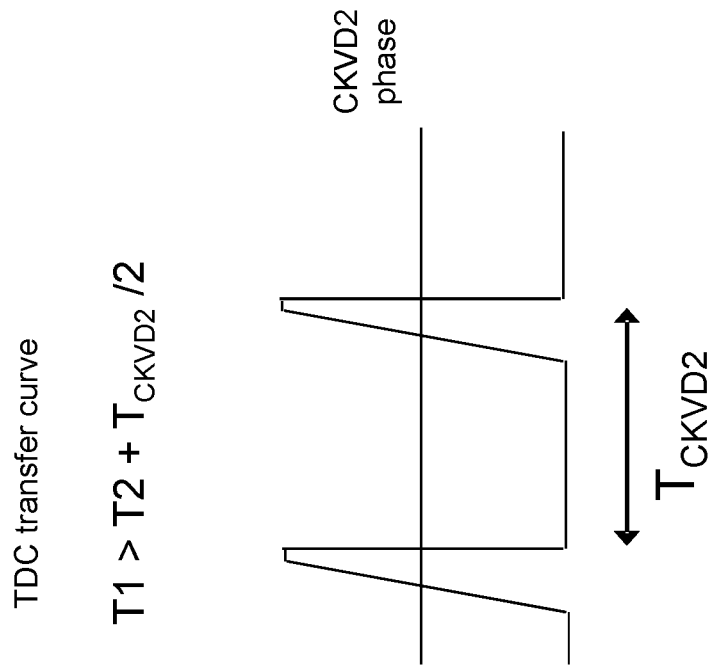
Figure 5A:
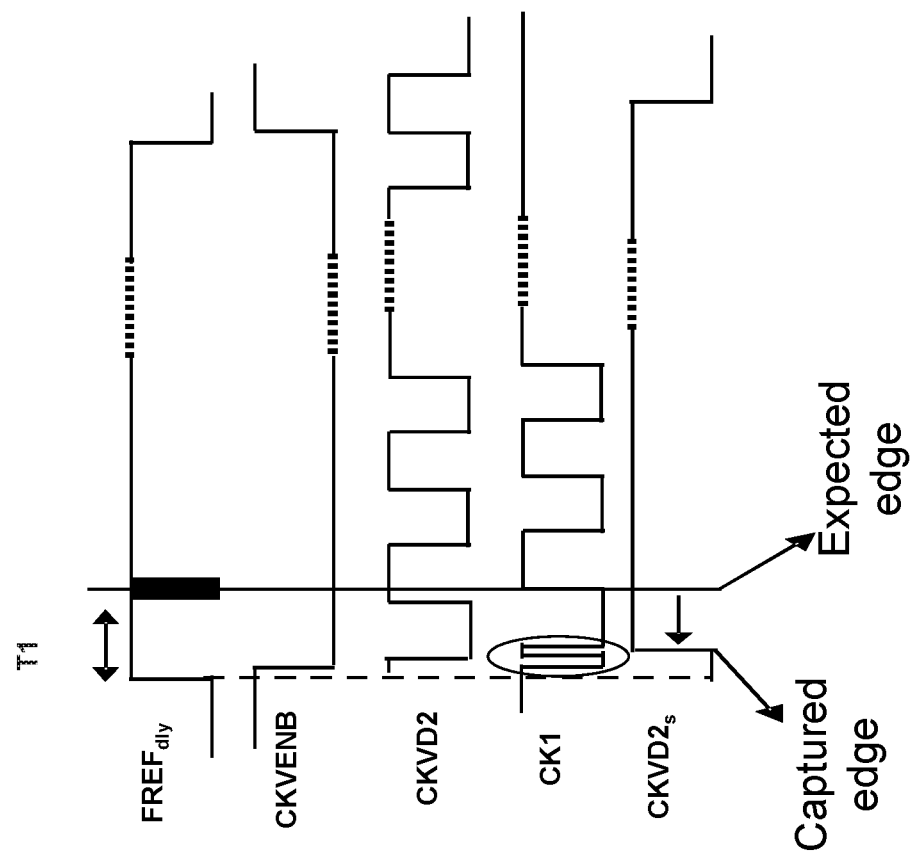

However, due to process variation, noise, or other parasitics introduced in the layout of the ADPLL or during operation, the TDC offset delay (T1) and the snapshot offset delay (T2) may be different from the desired values. As a result the TDC 15 may operate outside of the predetermined observation window. FIG. 4($a$) shows the case when the TDC offset delay is too short. In this case, the TDC offset delay T1 is not sufficient to compensate for the delay introduced by the snapshot circuit T2. As a result, the snapshot circuit 14 will have more chances to miss the expected CKVD2 edge and capture the next CKVD2 edge. Therefore, the probability of the TDC output code having more ones than zeros will be higher than expected as shown in FIG. 4($b$). This behaviour may be considered to be equivalent to the TDC observation window being placed close to the previous detection CKVD2 cycle. Similarly in FIG. 5($a$), the TDC offset delay (T1) may be longer than the snapshot circuit delay (T2) resulting in the snapshot circuit 14 to capture the previous CKVD2 edge instead of the expected edge. As a result, the TDC output code will have a higher probability to generate more zeros than ones, as shown in FIG. 5($b$).

Figure 6:
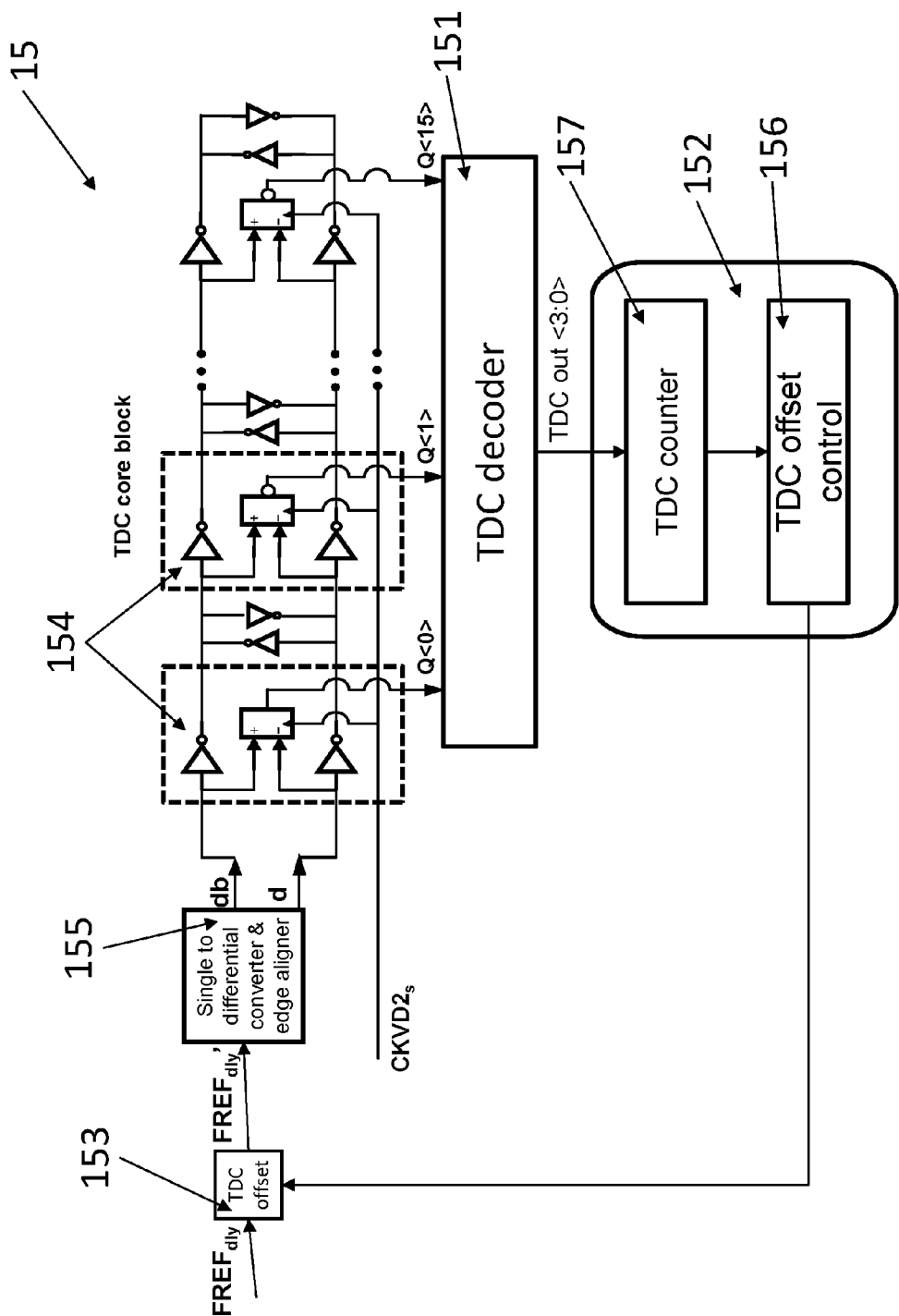
FIG. 6 shows a representation of a TDC according to embodiments of the present disclosure.

According to example embodiments of the present disclosure, in order to compensate for variations in the first and second offset delays, the TDC circuit 15 is provided with an offset calibration system, as shown in FIG. 6. The offset calibration system, may be connected to the TDC output, which when activated may be arranged for evaluating the difference between the first and second offset delay values by monitoring the TDC output code generated over a predetermined period of time. Based on the TDC output code the calibration system may be arranged for adjusting the difference between the first (T1) and second (T2) offset delay values so as to position the predetermined observation window with respect to the reference signal.

As a result, any variations in the first (T1) and second (T2) offset delay values may be compensated, thereby ensuring that the reference and enable signals are sampled by the TDC within the predetermined observation window. It has been found that by providing a calibration system which when activated is arranged for evaluating the difference between the first and second offset delay values, the difference between the first and second offset delay values may be dynamically adjusted so that the TDC is activated within the predetermined observation window. By processing the TDC output code, which is indicative of the phase difference between the reference signal and the enable signal, it is possible to determine whether the reference signal arrived within the predetermined time difference from the enable signal. As a result based on the TDC output code generated over a predetermined period of time the delay difference between the first and second offset delay values may be adjusted to position the TDC observation window with respect to the reference signal.

According to example embodiments of the present disclosure, the calibration system may comprise an offset calibration unit 152, as shown in FIG. 6, connected to the TDC output and arranged for evaluating the difference between the first (T1) and second (T2) offset delay values, and accordingly generate a delay adjustment control signal. The calibration system may further comprise a variable delay unit 153 connected to the offset calibration unit 152 and arranged for adjusting the first offset delay on the basis of the delay adjustment control signal.

The variable delay unit may be part of the TDC 15. By providing a calibration unit 152 arranged for generating, based on the TDC output code, a delay adjustment control signal used for controlling a variable delay unit 153, the first offset delay may be dynamically adjusted such that the TDC observation window is placed at the centre of the TDC transfer curve. For example, the calibration system may be arranged for adjusting the difference between the first (T1) and second (T2) offset delay values in such a way that a transition edge of the reference signal is positioned substantially in the middle of the predetermined observation window, e.g. by positioning the transition edge of the reference signal in the middle of the TDC transfer function.

By providing a calibration system, the offset delay adjustments may be effected without any external intervention purely based on the TDC output code. The delay adjustment control signal may be indicative of an offset delay adjustment value to be effected by the variable delay unit. For example, the variable delay unit 153 may be a digitally-controlled programmable variable delay arranged for adjusting the delay of the reference signal, $FREF_{dly}$, based on the delay adjustment control signal generated by the calibration unit 152, which may be indicative of the value by which the first offset delay (T1) needs to be adjusted so that the reference signal arrives within the predetermined observation window. In this way, any variations introduced in the first and second offset delay values may be compensated, thereby ensuring that the TDC operates in the predetermined observation window. As a result, with the system of the present disclosure variations in the first (T1) and second offset (T2) delay values may be dynamically adjusted, thereby ensuring the correct functionality of the TDC, which may lead to a higher performing ADPLL.

According to example embodiments of the present disclosure, the calibration unit may be further arranged for adjusting the second offset T2 in a similar manner to that described above with regards to the adjustments effected to the first offset. For example, the calibration unit may be arranged for adjusting, based on the TDC output, the second offset T2 by means of a variable delay unit. Furthermore, the calibration unit may be arranged for adjusting on the basis of the TDC output both the first and second offset delays T1 and T2 by means of at least one variable delay unit. In a further aspect, the calibration unit 152 may be arranged for evaluating the difference between the first and second offset delay values by accumulating the number of ones and zeros in the TDC output code generated over a predetermined period of time. For example, this may be achieved by providing at least one counter 157, which is arranged for counting the number of ones and zeros in the TDC output code. For example, the counter 157 may be connected to the most significant bit (MSB) of the TDC output code, and arranged for counting the number of ones and zeros generated by the MSB over a predetermined period of time.

According to example embodiments of the present disclosure, a calibration unit 152 may be provided with a TDC offset control unit 156 arranged for generating the delay adjustment control signal, which is used for controlling the variable delay unit 153. The TDC offset control unit 156 may be arranged for generating, based on the value of the counter, a delay adjustment control signal for adjusting the first offset delay value (T1). For example, the TDC offset control unit 156 may be arranged for increasing the offset delay of the reference signal when the number of zeros is greater than the number of ones in the TDC output code. Alternatively, the TDC offset control unit 156 may be arranged for decreasing the offset delay of the reference signal when the number of ones is greater than the number of zeros.

According to example embodiments of the present disclosure, the TDC 15 may be a flash TDC arranged for generating a TDC output code indicative of the phase difference between the reference signal and the enable signal measured within the predetermined observation window. However, other TDC architecture known in the art may be employed. The TDC 15, as shown in FIG. 6, may be provided with a number of delay stages 154, each arranged for comparing the reference signal to the enable signal.

According to example embodiments of the present disclosure, the calibration system may be activated off-line, i.e. when the ADPLL is not in operation, so as to calibrate the first (T1) and second (T2) offset delays before operating the ADPLL. According to alternative embodiments, the calibration system may be activated on-line, i.e. before every phase dictation by the TDC. In this way, any variations introduced in the first and second offset delay values due to noise or temperature during the operation of the ADPLL may be compensated.

Figure 7:
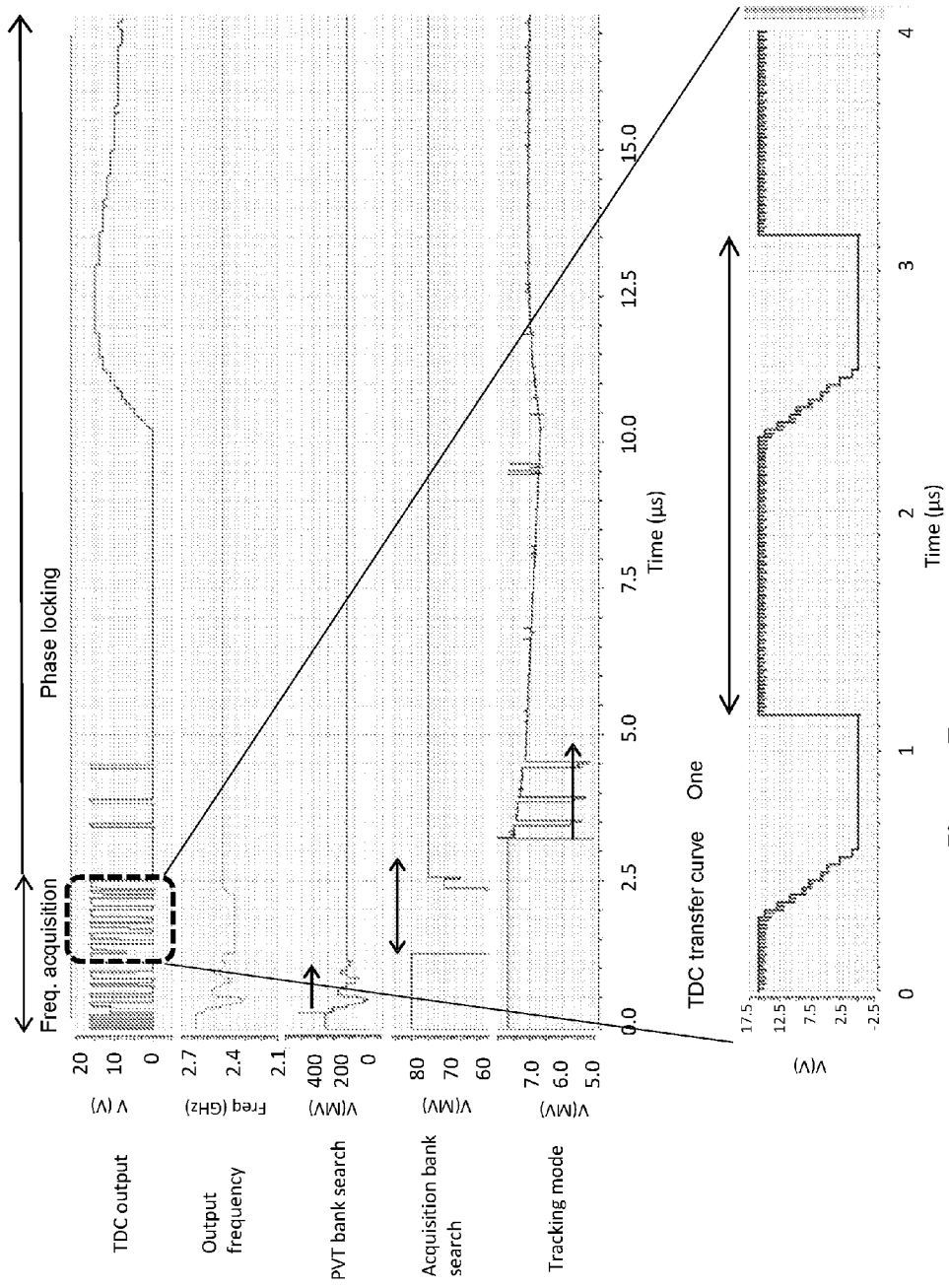
FIG. 7 shows an example of an ADPLL phase locking procedure.

FIG. 7 shows an example of measuring the TDC transfer function during ADPLL phase locking. Phase locking in PLLs has two phases. First is frequency acquisition which brings the variable clock frequency close to the targeted frequency. Once the variable clock (CKVD2) is close enough to the targeted frequency, the PLL may move to the second phase, phase tracking, to align the phases between variable and reference clocks. If the TDC, which acts as a phase difference digitizer, gives an output approaching zero, then it means the phases of the two clocks are aligned. During the frequency acquisition phase, the phase difference between the reference phase, e.g., $FREF_{dly}$, and variable clock, e.g., CKVD2, continuously rotates, and the TDC gives an output which continuously sweeps all of the codes, as shown in FIG. 7. This behaviour may be explained by the fact that the phase difference between the reference phase and variable phase is continuously rotating because of the frequency difference between the variable clock and targeted output. Hence, by reading out the TDC output during the frequency acquisition phase, the TDC transfer curve can be directly measured.

What is claimed is:

1. An all-digital-phase-locked-loop (ADPLL) comprising:
   a digitally controlled oscillator (DCO) arranged to generate a DCO output signal from a frequency code word (FCW); and
   a feedback loop comprising a set of components for controlling the DCO, wherein the set of components comprises:
      a time-to-digital converter (TDC) configured for phase detection within a predetermined observation window, wherein the TDC is arranged to define the predetermined observation window by receiving at least a reference signal having a first offset delay and an enable signal having a second offset delay, and to generate a TDC output code indicative of a phase difference between the reference signal and the enable signal measured within the predetermined observation window;
      a subset of components arranged to generate the enable signal from the DCO output signal, wherein the generated enable signal contains a transition edge derived from the DCO output signal, and wherein the enable signal is arranged to activate the TDC to measure the phase difference between the reference signal and the enable signal within the predetermined observation window; and
      an offset calibration system connected to the TDC output, wherein the offset calibration system, when activated, is arranged to evaluate a difference between the first and second offset delay values by monitoring the TDC output code generated over a predetermined period of time, and to adjust the difference between the first and second offset delay values to position the predetermined observation window with respect to the reference signal, and thereby to adjust the activation of the TDC so that the TDC operates within the predetermined observation window.

2. The ADPLL of claim 1, wherein the offset calibration system further comprises:
   an offset calibration unit connected to the TDC output and arranged to evaluate the difference between the first and second offset delay values, and to generate a delay adjustment control signal; and
   a variable delay unit connected to the offset calibration unit and arranged to adjust the first offset delay on the basis of the delay adjustment control signal.

3. The ADPLL of claim 2, wherein the variable delay unit is part of the TDC.

4. The ADPLL of claim 1, wherein the offset calibration system is arranged to adjust the difference between the first and second offset delay values in such a way that a transition edge of the reference signal is positioned substantially in a middle of the predetermined observation window.

5. The ADPLL of claim 1, wherein the offset calibration system is arranged to adjust the difference between the first and second offset delay values in such a way that a transition edge of the reference signal is positioned substantially in a middle of a TDC transfer curve.

6. The ADPLL of claim 1, wherein the offset calibration system is further arranged to evaluate the difference between the first and second offset delay values by counting the number of ones and zeros generated by a most significant bit (MSB) of the TDC output code.

7. The ADPLL of claim 6, wherein the offset calibration system comprises a TDC offset control unit arranged to increase the first offset delay when the number of zeros is greater than the number of ones, as generated by the MSB of the TDC output code.

8. The ADPLL of claim 6, wherein the offset calibration system comprises a TDC offset control unit arranged to decrease the first offset delay when the number of ones is greater than the number of zeros, as generated by the MSB of the TDC output code.

9. The ADPLL of claim 1, wherein the feedback loop further comprises components arranged to detect a coarse part of a phase, and a fine part of the phase.

10. The ADPLL of claim 1, wherein the feedback loop further comprises components arranged to detect an integer part of the phase, and a fractional part of the phase.

11. The ADPLL of claim 1, wherein the TDC is a flash TDC.

12. The ADPLL of claim 1, wherein the offset calibration system is connected directly to the TDC output.

13. A method for operating an all-digital-phase-locked-loop (ADPLL) comprising a digitally controlled oscillator (DCO) arranged to generate a DCO output signal, and a feedback loop comprising a set of components for controlling the DCO, the method comprising:
   activating a time-to-digital converter (TDC) configured for phase detection within a predetermined observation window, wherein the TDC is arranged to define the predetermined observation window by receiving at least a reference signal having a first offset delay and an enable signal having a second offset delay, wherein activating the TDC further comprises:
      providing the reference signal to the TDC, and
      generating the enable signal from the DCO output signal, wherein the generated enable signal contains a transition edge derived from the DCO output signal, and wherein the enable signal is arranged to activate the TDC to measure a phase difference between the reference signal and the enable signal within the predetermined observation window;
   generating a TDC output code indicative of the phase difference between the reference signal and the enable signal measured within the predetermined observation window; and
   performing, using a calibration system connected to the TDC output, an offset delay calibration, wherein performing the offset delay calibration comprises:
      evaluating a difference between the first and second offset delay values by monitoring the TDC output code generated over a predetermined period of time, and
      adjusting the difference between the first and second offset delay values to position the predetermined observation window with respect to the reference signal, and thereby activating the TDC within the predetermined observation window.

14. The method of claim 13, wherein performing the offset delay calibration further comprises:
   generating a delay adjustment control signal based on the difference between the first and second offset delay values; and
   applying the delay adjustment control signal to a variable delay unit to adjust the first offset delay.

15. The method of claim 13, wherein the offset delay calibration is performed off-line.

16. The method of claim 13, wherein the offset calibration is performed on-line during a frequency acquisition stage before activating the TDC for phase locking.

17. The method of claim 13, wherein the calibration system is connected directly to the TDC output.

* * * * *